(12) United States Patent
Sugiyama et al.

(10) Patent No.: US 7,361,954 B2
(45) Date of Patent: Apr. 22, 2008

(54) POWER SEMICONDUCTOR DEVICE

(75) Inventors: Koichi Sugiyama, Yokohama (JP); Masakazu Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/458,234

(22) Filed: Jul. 18, 2006

(65) Prior Publication Data
US 2007/0018242 A1    Jan. 25, 2007

(30) Foreign Application Priority Data
Jul. 20, 2005    (JP)    ............................ 2005-210162

(51) Int. Cl.
*H01L 29/76*    (2006.01)
(52) U.S. Cl. ...................... 257/330; 257/331; 257/341; 257/E29.201
(58) Field of Classification Search ................ 257/288, 257/330–334, 341, 401, E29.027, E29.201
See application file for complete search history.

(56) References Cited

U.S. PATENT DOCUMENTS

| | | | |
|---|---|---|---|
| 6,278,155 B1 * | 8/2001 | Okabe et al. ............... | 257/328 |
| 6,359,306 B1 | 3/2002 | Ninomiya | |
| 6,583,010 B2 * | 6/2003 | Mo ............................. | 438/270 |
| 6,774,408 B2 * | 8/2004 | Ninomiya .................... | 257/136 |
| 6,777,783 B2 * | 8/2004 | Matsuda ...................... | 257/586 |
| 6,891,224 B2 * | 5/2005 | Ogura et al. ................. | 257/330 |
| 2006/0081919 A1 | 4/2006 | Inoue et al. | |

FOREIGN PATENT DOCUMENTS

| | | |
|---|---|---|
| EP | 1 065 710 A2 | 1/2001 |
| JP | 2001-15743 | 1/2001 |

* cited by examiner

*Primary Examiner*—T. N. Quach
(74) *Attorney, Agent, or Firm*—Oblon, Spivak, McClelland, Maier & Neustadt, P.C.

(57) ABSTRACT

Disclosed is a power semiconductor device, including: a gate electrode having a cross section having a length in a vertical direction, and having a shape extending in a direction orthogonal to the cross section; a gate insulating film surrounding the gate electrode; an n-type source layer positioning to face the gate electrode via the gate insulating film; a p-type base layer adjacent to the n-type source layer and positioning to face the gate electrode via the gate insulating film; an n-type base layer adjacent to the p-type base layer and positioning to face the gate electrode via the gate insulating film without being in contact with the n-type source layer; and a main electrode being in contact with the n-type source layer and the p-type base layer with plural lateral planes extending in a direction crossing the direction in which the gate electrode is extending.

20 Claims, 7 Drawing Sheets

POWER SEMICONDUCTOR DEVICE

CROSS-REFERENCE TO RELATED APPLICATIONS

This application is based upon and claims the benefit of priority from the prior Japanese Patent Application No. 2005-210162, filed on Jul. 20, 2005; the entire contents of which are incorporated herein by reference.

BACKGROUND

1. Field of the Invention

The present invention relates to a power semiconductor device performing a switching of current, and in particular, to a power semiconductor device having an insulated gate structure.

2. Description of the Related Art

In general, a generated voltage (on-state voltage) in an on-state is expected to be enough small to eliminate a loss and so on in a power semiconductor device performing a current switching. To attain this object, a method in which a channel density is increased by forming a gate electrode pitch small can be adopted in a power semiconductor device having an insulated gate such as an IGBT (insulated gate bipolar transistor), a MOSFET, and so on.

In general, a mask alignment accuracy is necessary to be enhanced to form the gate electrode pitch to be small. Inparticular, a required alignment accuracy on a contact surface between a semiconductor region being a path of a current to be switched and an emitter electrode region (of an IGBT), further increases in accordance with a smallness and narrowness of the gate electrode forming small. Consequently, a difficulty in fabrication process increases. It is conceivable that an insulating film is formed in advance so as to surround only all of the gate electrodes, and then a surface of the semiconductor region is made to be the contact surface with the emitter electrode region, to make the gate electrode forming pitch small without increasing the difficulty in fabrication process as stated above. According to this method, the emitter electrode region can be formed easily so as to avoid a contact with the gate electrode, and it becomes possible to make the required alignment accuracy in forming the contact surface between the semiconductor region and the emitter electrode region unnecessary in principle.

However, in either case, when the channel density is increased, an excessive current flows at the time of a load short circuit, and a problem as a semiconductor device may be easy to occur such that the semiconductor device may be broken before, for example, a protection circuit works even if it is provided. Incidentally, there is a semiconductor device to be a reference disclosed in the following Patent Document 1, though a structure and a manufacturing method are different from the semiconductor device to be provided by the present application.

[Patent Document 1] JP-A 2001-15743 (KOKAI)

SUMMARY

A power semiconductor device according to one mode of the present invention includes: a gate electrode having a cross section having a length in a vertical direction, the gate electrode having a shape extending in a direction orthogonal to the cross section; a gate insulating film surrounding the gate electrode; an n-type source layer positioning to face the gate electrode via a part of the gate insulating film; a p-type base layer adjacent to the n-type source layer and positioning to face the gate electrode via another part of the gate insulating film; an n-type base layer adjacent to the p-type base layer and positioning to face the gate electrode via still another part of the gate insulating film without being in contact with the n-type source layer; and a main electrode being in contact with the n-type source layer and the p-type base layer with plural lateral planes extending in a direction crossing the direction in which the gate electrode is extending.

A power semiconductor device according to another mode of the present invention includes: a control electrode having a cross section having a length in a vertical direction, the control electrode having a shape extending in a direction orthogonal to the cross section; an insulating film surrounding the control electrode; a first semiconductor layer having a first conductivity type, positioning to face the control electrode via a part of the insulating film; a second semiconductor layer having a second conductivity type, adjacent to the first semiconductor layer and positioning to face the control electrode via another part of the insulating film; a third semiconductor layer having the first conductivity type, adjacent to the second semiconductor layer and positioning to face the control electrode via still another part of the insulating film without being in contact with the first semiconductor layer; a first main electrode being in contact with the first semiconductor layer and the second semiconductor layer with plural lateral planes extending in a direction crossing the direction in which the control electrode is extending; and a second main electrode provided in a side opposite to the first main electrode through the third semiconductor layer.

DETAILED DESCRIPTION (Explanation of Embodiments)

Figure 1A:
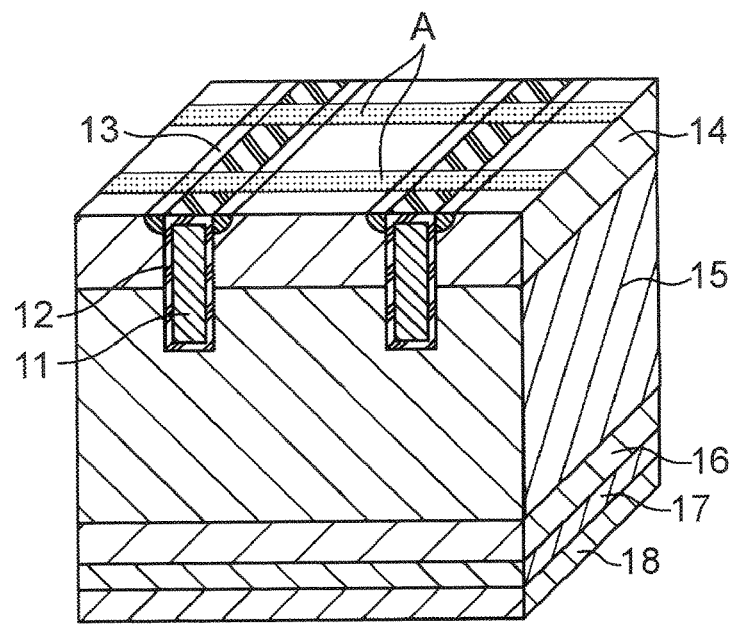
FIG. 1A and FIG. 1B are virtually cut perspective views schematically showing a structure of a power semiconductor device (IGBT) according to an embodiment of the present invention.

Examples of the present invention are described with reference to the drawings, but these drawings are provided only for an illustrative purpose and by no means are intended to limit the present invention.

In an semiconductor device according to one mode of the present invention, a main electrode performing a contact to an n-type source layer and a p-type base layer being semiconductor regions in which a current to be switched is flowing, is in contact with these n-type source layer and the p-type base layer with plural lateral planes extending in a direction crossing a direction in which a gate electrode is extending. Namely, it is a direction setting of a contact region in which a positioning accuracy with a disposition of the gate electrode is not necessary to be regarded as a problem, and therefore, a difficulty in fabrication process to form the contact region does not increase even if a channel density is high. Further, a function as a source region of the n-type source layer is lost at a part thereof when an excessive current flows This is because a contact surface becomes to be limited because the lateral planes extending in the direction crossing the direction in which the gate electrode is extending exist in plural, and therefore, a minute resistance occurs at the source region which is not in contact with the main electrode directly. Consequently, the channel density decreases to prevent a breakdown when the excessive current is to flow.

Incidentally, here, the "lateral plane" means a plane in a lateral direction as a semiconductor device, and not a plane in a vertical direction.

As a form, the gate electrode may be included in a trench gate structure. It is an effective structure to make a gate electrode forming pitch small.

Besides, as another form, the gate electrode included in the trench gate structure may be formed plural in parallel with the direction in which the gate electrode is extending, and intervals between portions of the trench gate structures in which the plural gate electrodes are respectively included may be 1 µm or less. It is to increase a channel density by making the intervals between the trench gate structures with each other 1 µm or less. It is suitable for a case when the intervals between the trench gate structures with each other are minute as stated above, because a positioning accuracy of an electrode forming is not necessary.

Besides, as still another form, the n-type source layer may be extendingly formed in parallel with the direction in which the gate electrode is extending. It is an effective structure to make the channel density high.

Besides, as yet another form, the p-type base layer may be composed of a region whose p-type concentration is relatively low and a region whose p-type concentration is relatively high, the region whose p-type concentration is relatively high may be in contact with the main electrode, and the region whose p-type concentration is relatively low may not be in contact with the main electrode. The region of which p-type concentration is relatively high is brought into contact with the main electrode, and thereby, an ohmic contact is ensured.

Besides, as yet another form, the n-type source layers may exist two per one gate electrode. For example, an ion implantation is performed by using a mask for forming a trench for the gate electrode, and then, such form is realized. An advantage as a manufacturing process can be obtained.

Besides, as yet another form, the n-type source layer may exists one per one gate electrode. For example, the ion implantation is performed by using a mask for forming only the n-type source layer, and then, such form is realized. It is possible to increase the channel density also in such form if a gate electrode forming pitch is made small.

Besides, as yet another form, the n-type source layer may be composed of a region whose n-type concentration is relatively low and a region whose n-type concentration is relatively high, and the region whose n-type concentration is relatively low may be in contact with the main electrode, and the region whose n-type concentration is relatively high may not be in contact with the main electrode. The region of which n-type concentration is relatively low is in contact with the main electrode, and thereby, a minute resistance is formed from the electrode to the source region. Herewith, the breakdown as the semiconductor device can further be prevented by losing a function as the source region when the excessive current is to be flowed.

Besides, as yet another form, the n-type source layer may be extendingly formed with an angle of 45 degrees or less relative to the direction in which the gate electrode is extending. The difficulty in fabrication process to set the contact region does not increase even if the n-type source layer is formed inclining relative to the direction of the gate electrode as stated above. Besides, a function as the source region becomes incomplete when the excessive current is to be flowed to prevent the breakdown. Incidentally, if the angle is over 45 degrees, the required positioning accuracy to set the contact region increases little by little. This is because an alignment margin in the direction in which the gate electrode is extending becomes small.

Figure 1B:
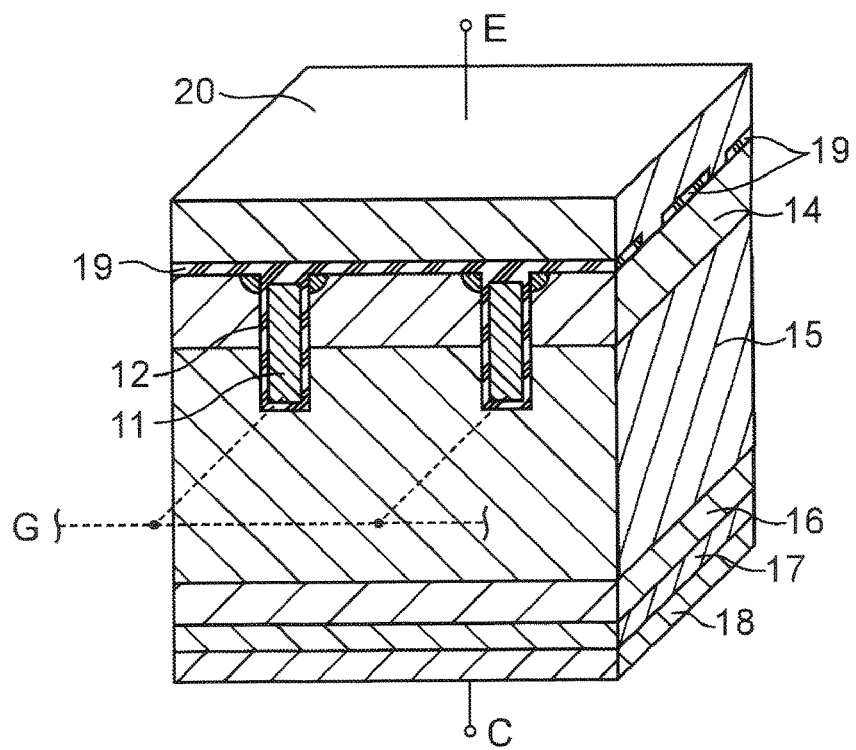

In consideration of the above, hereinafter, embodiments of the present invention are described with reference to the drawings. FIG. 1A and FIG. 1B are virtually cut perspective views schematically showing a structure of a power semiconductor device (IGBT) according to an embodiment of the present invention. FIG. 1B is a view of a whole device including an emitter electrode 20 as a main electrode, and FIG. 1A is a virtual view showing an upper surface by cutting at a height of the upper surface of a p-type base layer 14 in FIG. 1B to show characteristics thereof. A cut surface pattern of a front side shown in both drawings is formed repeatedly in a not-shown right and left direction. Besides, it is the same pattern in not-shown forward and backward direction.

As shown in the drawing, this IGBT has gate electrodes (control electrodes) 11, gate insulating films (insulating films) 12, n-type source layers (first semiconductor layers having a first conductivity type) 13, a p-type base layer (a second semiconductor layer having a second conductivity type) 14, an n-type base layer (a third semiconductor layer having the first conductivity type) 15, an n-type buffer layer 16, a p-type emitter layer 17, a collector electrode (a second main electrode) 18, insulating films 19, and the emitter electrode 20. Regions having a dot pattern A in FIG. 1A are a lower surface of the emitter electrode 20, and shows a region surface reaching the n-type source layers 13 and the p-type base layer 14 being semiconductor regions.

The gate electrodes 11 are embedded within respective plural trenches, respectively have rectangular cross sections which are long in a vertical direction, and have shapes extending in a direction orthogonal to the crosssections thereof. At extended end portions, they constitute a gate terminal G by electrically conducting with each other. Besides, the gate electrode 11 is surrounded by the gate insulating film 12, and it is respectively facing the n-type source layer 13 at an upper portion, the p-type base layer 14 below that, and the n-type base layer 15 further below that via the gate insulating film 12. A channel is formed at a region of the p-type base layer 14 facing the gate electrode 11 via the gate insulating film 12. Incidentally, it is more practical that a cross-sectional shape of the gate electrode 11 is not a long rectangular state as shown in the drawing, and the shape is rounded at a lower side to aim for an electric field relaxation. The "vertical direction" is a vertical direction as the semiconductor device.

At a lower side of the n-type base layer 15, the n-type buffer layer 16, the p-type emitter layer 17, the collector electrode 18 are respectively positioned to be laminated. The collector electrode 18 functions as a collector terminal C. At an upper side of the n-type base layer 15, the p-type base layer 14 is positioned to be laminated, and the n-type source layers 13 are selectively formed at regions of both sides of the trench at an upper surface side of the p-type base layer 14. The n-type source layers 13 exist two per one gate electrode 11, and they are respectively formed in parallel with the direction in which the gate electrode 11 is extending Herewith, a channel density is improved, and a voltage drop Vch across the channel is reduced to thereby eliminate an ON resistance. The respective n-type source layers 13 are preferable to be formed narrow for some extent so that the resistance becomes obvious by a large current.

The insulating films 19 are selectively formed to cover at least the upper surfaces of the gate electrodes 11, and to cover the semiconductor region except the regions A The emitter electrode 20 is formed for a whole surface including on the insulating films 19 so as to contact with the n-type source layers 13 and the p-type base layer 14 within the regions A. The emitter electrode 20 functions as an emitter terminal E. The regions A are plural lateral planes extending in an orthogonal direction to the direction in which the gate electrodes 11 are extending, and they are in stripe state because they exist in plural.

Operations of this IGBT as a transistor are as follows. A positive voltage is applied on the collector electrode 18, a negative voltage is applied on the emitter electrode 20, and when a positive voltage is applied to the gate electrode 11 relative to the emitter electrode 20, the channel is formed at the region of the p-type base layer 14 next to the n-type source layer 13 and facing the gate insulating film 12. An electron is injected from the n-type source layer 13 to the n-type base layer 15 via this channel, and a hole is injected from the p-type emitter layer 17 to the n-type base layer 15 via the n-type buffer layer 16 with corresponding to the above. Herewith, a pnp transistor composed of the p-type emitter layer 17, the n-type base layer 15+ the n-type buffer layer 16, and the p-type base layer 14 is turned on, and as the IGBT an on-state is obtained. When the positive voltage is not applied between the emitter electrode 20 and the gate electrode 11, the channel disappears, then the above-stated transistor is turned off, and as the IGBT an off-state is obtained.

As sizes of a structure shown in FIG. 1A, FIG. 1B, for example, a width of the gate electrode 11 including the gate insulating film 12 (hereinafter, a portion of the gate electrode 11 including the gate insulating film 12 is also referred to as "trench gate structure portion") can be set as approximately from 0.5 μm to 2 μm, and an interval (inner size) between the trench gate structure portions with each other can be set as approximately 1 μm or less. Even though it is such a minute interval, since the region in which the emitter electrode 20 is in contact with the n-type source layer 13 and the p-type base layer 14 being semiconductor layers are made to be the regions A in the drawing, and namely, it is orthogonal to the direction in which the intervals between the trench gate structure portions with each other are extending, a difficulty in positioning does not occur for a setting of a contact region.

Besides, the emitter electrode 20 is not in contact with all over the upper surfaces of the n-type source layers 13 because of the contact at the regions A, and portions of the n-type source layers 13 which are not in contact with the emitter electrode 20 become obvious as a resistance to make the channel next to the portions disappear in case of a load short circuit and so on. Consequently, the channel density decreases, the excessive current is suppressed, and a breakdown can be prevented. Incidentally, respective widths of the regions A can be set as, for example, 1 μm or more, and intervals (inner sizes) of those can be set as, for example, from 1 μm to 10 μm. The points of the electrode positioning and the breakdown prevention as stated above will be described again in comparison with a comparative reference example.

As for the sizes of the other portions, a depth in which the gate insulating film 12 in FIG. 1A is in contact with the n-type base layer 15 at the lower side is, for example, from 2 μm to 6 μm, and a depth which the p-type base layer 14 reaches in the same drawing can be set as, for example, from 1 μm to 3 μm. Besides, a thickness of the gate insulating film 12 can be set as, for example, approximately 100 nm both at a side portion and lower portion of the gate electrode 11. A thickness of the insulating film 19 on the upper surface of the gate electrode 11 in FIG. 1A (not in FIG. 1B) can be set as, for example, approximately 0.2 μm. The thickness of the insulating layer 19 on the p-type base layer 14 and on the n-type source layer 13 can be set as, for example, from 0.5 μm to 1 μm.

Figure 8:
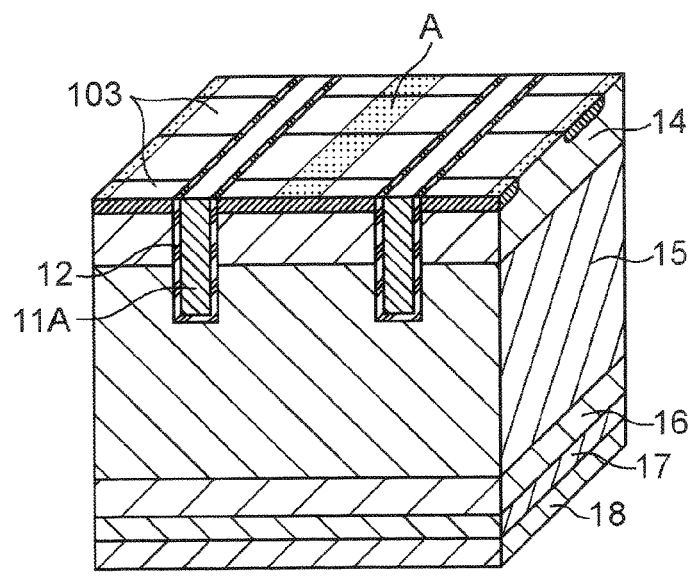
FIG. 8 is a virtually cut perspective view schematically showing a structure of a power semiconductor device (IGBT) as a comparative reference example.

FIG. 8 is a virtually cut perspective view schematically showing a structure of a power semiconductor device (IGBT) as a comparative reference example. A way of looking as a view is the same as in FIG. 1A. Besides, the same reference numerals and symbols in FIG. 1A and FIG. 1B are used to designate the same and corresponding portions. In this comparative reference example, n-type source layers 103 are formed in a direction orthogonal to a direction in which gate electrodes 11A are extending, to make a positioning accuracy between them unnecessary. However, it is necessary that regions A with which a not-shown emitter electrode is in contact, is made to be a stripe state in the same direction with the direction in which the gate electrodes 11A are extending. When intervals between the gate electrodes 11A are narrow, a positioning of trenches to form the gate electrodes 11A and the regions A is difficult. Besides, a channel density is smaller compared to the one shown in FIG. 1A and FIG. 1B.

Figure 9:
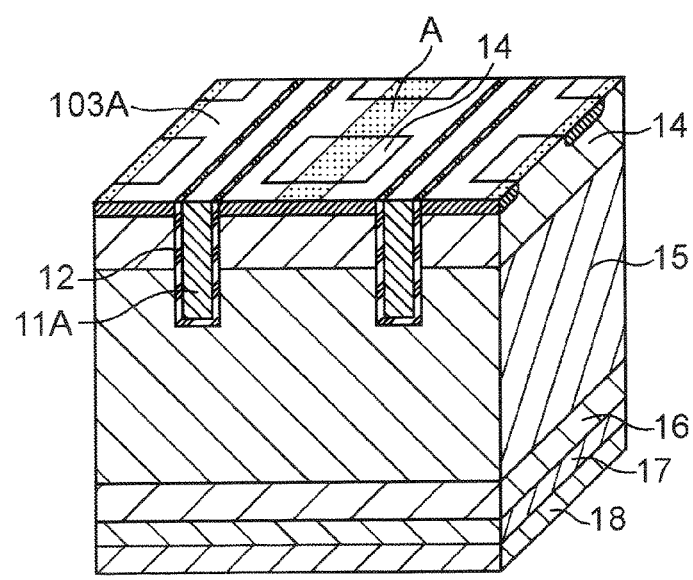
FIG. 9 is a virtually cut perspective view schematically showing a structure of a power semiconductor device (IGBT) as another comparative reference example.

FIG. 9 is a virtually cut perspective view schematically showing a structure of a power semiconductor device (IGBT) as another comparative reference example. A way of looking as a view is the same as in FIG. 1A. Besides, the same reference numerals and symbols in FIG. 1A and FIG. 1B are used to designate the same and corresponding portions. In this comparative reference example, n-type source layers 103A are also formed to sandwich the gate electrodes 11A to be formed in ladder state as a whole, and therefore, a channel density is improved compared to the one shown in FIG. 8. However, in this case, a difficulty in fabrication process further increases because a positioning of the n-type source layers 103A and the trenches to form the gate electrodes 11A in a right and left direction in the drawing becomes also necessary.

Figure 10:
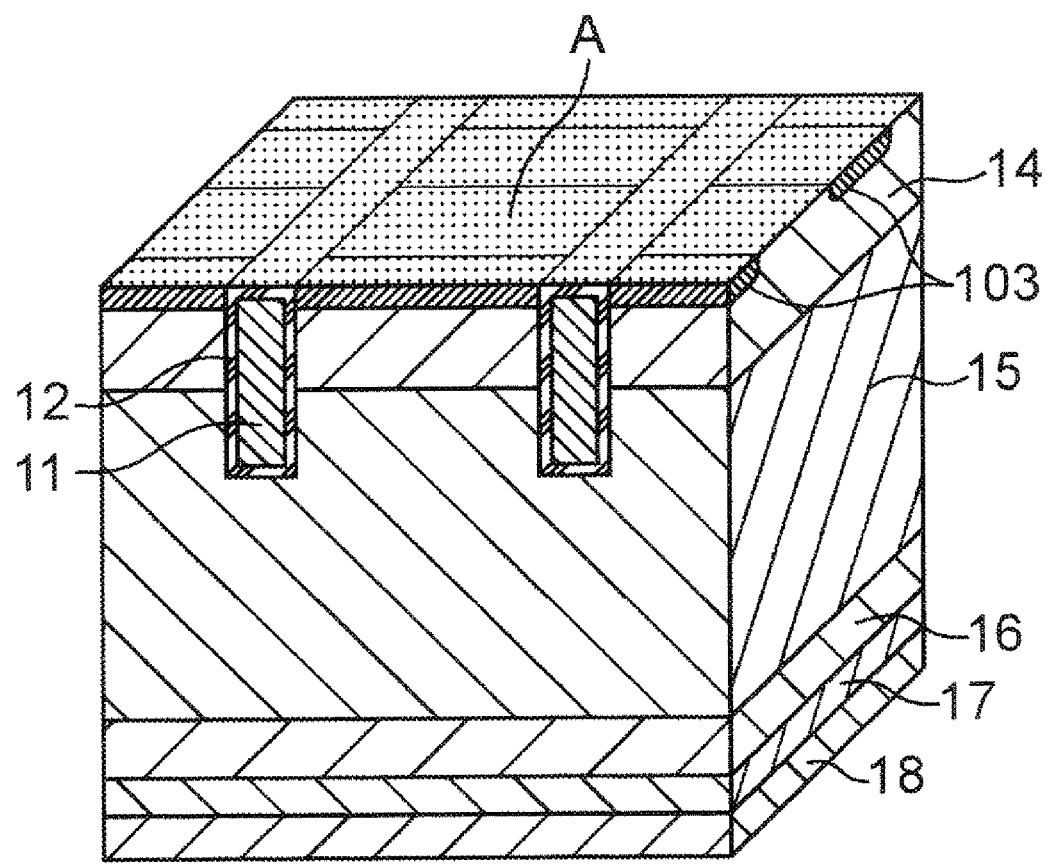
FIG. 10 is a virtually cut perspective view schematically showing a structure of a power semiconductor device (IGBT) as still another comparative reference example.

FIG. 10 is a virtually cut perspective view schematically showing a structure of a power semiconductor device (IGBT) as still another comparative reference example. A way of looking as a view is the same as in FIG. 1A. Besides, the same reference numerals and symbols in FIG. 1A, FIG. 1B and FIG. 8 are used to designate the same and corresponding portions. In this comparative reference example, insulating films are formed in advance only on gate electrodes 11, as it is obvious by comparison with FIG. 8. N-type source layers 103 are the same as the one shown in FIG. 8. In this case, a region A with which a not-shown emitter electrode is in contact is made for a whole surface as shown in the drawing, and a positioning of an electrode contact with the semiconductor region including trenches in which the gate electrodes 11 are embedded becomes unnecessary. However, the emitter electrode is in contact with all of an upper surface of the n-type source layers 103, and therefore, resistances of then-type source layers 103 are difficult to be obvious when a large current flows such as at a time of a load short circuit, and it is easy to breakdown.

By comparison with the comparative reference examples as stated above, advantages of the embodiment shown in FIG. 1A, FIG. 1B become clearer. Incidentally, in the embodiment shown in FIG. 1A, FIG. 1B, the regions A are disposed so as to orthogonal to the direction in which the trench gate structure portions are extending, but as a modified example, they can extend in a direction not to orthogonal, but just to cross the direction in which the trench gate structure portions are extending. In such embodiment, it goes without saying that the respective advantages of the electrode positioning and the breakdown prevention are maintained.

Figure 2:
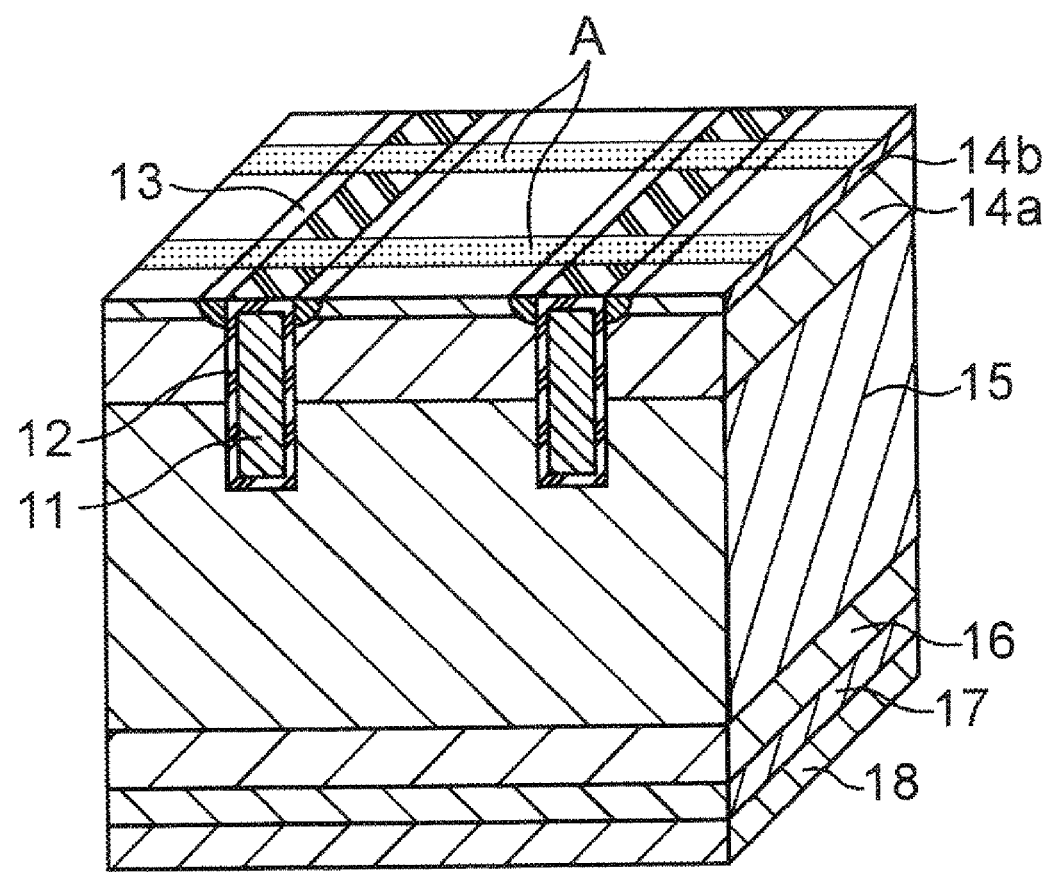
FIG. 2 is a virtually cut perspective view schematically showing a structure of a power semiconductor device (IGBT) according to another embodiment of the present invention.

Next, a power semiconductor device (IGBT) according to another embodiment of the present invention is described with reference to FIG. 2. FIG. 2 is a virtually cut perspective view schematically showing a structure of the power semiconductor device (IGBT) according to another embodiment of the present invention. In FIG. 2, the same reference numerals and symbols in FIG. 1A and FIG. 1B are used to designate the same and corresponding portions. Descriptions for the portions will not be given. Incidentally, FIG. 2 is a view corresponding to FIG. 1A, and a view corresponding to FIG. 1B is not given because it is obvious.

In this embodiment, a p-type base layer 14 is composed of a p-type base layer 14a of which p-type concentration is relatively low and a p-type base layer 14b (=p-type contact layer) of which p-type concentration is relatively high. The p-type base layer 14b is formed at an upper surface side of the p-type base layer 14a, and a contact with a not-shown emitter electrode at regions A is exclusively performed by the p-type base layer 14b side of which p-type concentration is relatively high. By setting as stated above, a contact between the emitter electrode and the p-type base layer is surely made ohmic to reduce a resistance, and besides, a resistance as a whole p-type base layer is made small for an extent of a thickness of the p-type base layer 14b of which p-type concentration is relatively high. The thickness of the p-type base layer 14b is set as, for example, approximately 0.3 μm. In this embodiment, an impurity concentration of the p-type base layer 14a of which p-type concentration is relatively low can be controlled, and thereby, a threshold voltage can be changed for some extent.

Next, forming processes of the n-type source layer 13 and a periphery thereof in the IGBT shown in FIG. 2 are described with reference to FIG. 3A to FIG. 3E. FIG. 3A to FIG. 3E are process drawings schematically showing the forming processes of the n-type source layer 13 and the periphery thereof in the IGBT shown in FIG. 2, but it is approximately the same in the embodiment shown in FIG. 1A and FIG. 1B. In FIG. 3A to FIG. 3E, the same reference numerals and symbols in FIG. 1A, FIG. 1B and FIG. 2 are used to designate the same and corresponding portions. In the embodiments shown in FIG. 1A, FIG. 1B, and FIG. 2, it seems difficult to form and perform a positioning of the trenches to form the gate electrodes 11 and the n-type source layers 13, but the difficulty can be avoided as stated below.

Figure 3A:
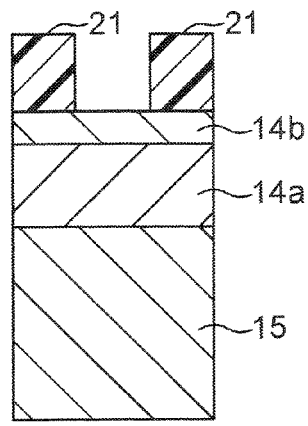
FIG. 3A, FIG. 3B, FIG. 3C, FIG. 3D, and FIG. 3E are process drawings schematically showing a forming process of an n-type source layer 13 and a periphery thereof in the IGBT shown in FIG. 2.

At first, as shown in FIG. 3A, the p-type base layer 14a of which p-type concentration is relatively low and the p-type base layer 14b of which p-type concentration is relatively high are formed to be laminated on the n-type base layer 15. For example, after the p-type base layer 14a is formed by performing an ion implantation and diffusion of, for example, boron to be a p-type impurity into the n-type base layer 15, and further, the p-type base layer 14b is to be formed by performing the ion implantation of, for example, boron while changing an acceleration energy and a dose amount. Incidentally, in case of the embodiment shown in FIG. 1A and FIG. 1B, it is formed as the single p-type base layer 14. After the p-type base layers 14a, 14b are formed, a mask 21 composed of, for example, an oxide film having a predetermined pattern is provided on an upper surface to process and form the trenches for the gate electrodes 11 (FIG. 3A).

Figure 3B:
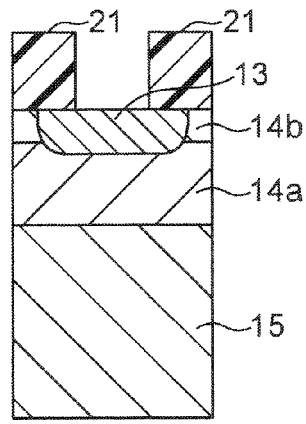

Next, an ion implantation of, for example, phosphorus to be an n-type impurity is performed for the p-type base layer 14b so that an implantation depth reaches into the p-type base layer 14a, by using this mask 21. At this time, the n-type source layer 13 is formed to spread up to a lower side of the mask 21 as shown in FIG. 3B by performing the ion implantation from a slightly oblique direction, or by performing the ion implantation perpendicularly and thereafter making a thermal diffusion, or performing both of them.

Figure 3C:
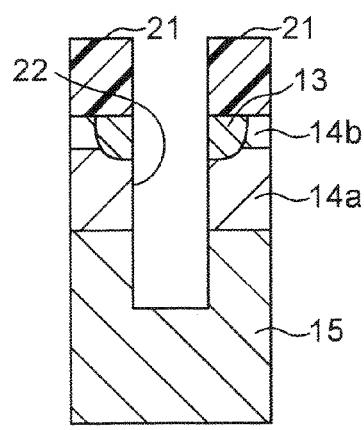
Figure 3D:
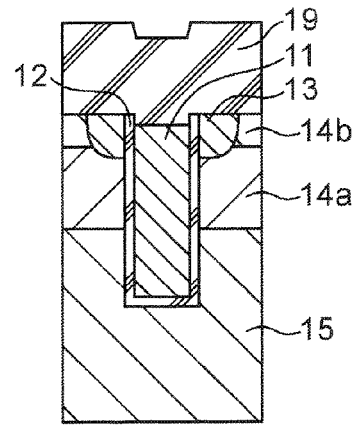

Next, as shown in FIG. 3C, a trench 22 reaching into the n-type base layer 15 penetrating the n-type source layer 13 and the p-type base layer 14a is formed by using, for example, an RIE (reactive ion etching) method while again using the mask 21. Subsequently, as shown in FIG. 3D, the gate insulating film 12 is formed by, for example, thermal oxidizing sidewalls and a bottom surface of the trench 22.

After that, the mask 21 are removed, and, for example, polycrystalline silicon is deposited by, for example, a CVD (chemical vapor deposition) method to include inside of the trench in which the gate insulating film 12 is formed. Further, the deposited polycrystalline silicon is etched back, and remained only inside of the trench while falling down slightly to make it to be the gate electrode 11 (FIG. 3D). Subsequently, the insulating film 19 is deposited for a whole surface (FIG. 3D). At this time, a step may be formed at an upper surface of the deposited insulating film 19 according to a setting of a width of the trench 22 (especially when it is wide) as shown in FIG. 3D, and there is a possibility to expose the gate electrode 11 if an etching of the insulating film 19 to expose the region A is performed with this state.

Figure 3E:
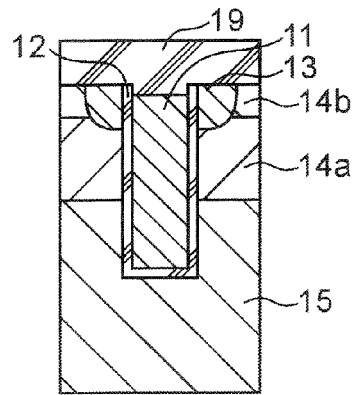

The upper surface side of the insulating film 19 is smoothed by using, for example, a CMP (chemical mechanical polishing) method as shown in FIG. 3E after the insulating film 19 is deposited for the whole surface, and thereafter, a selective etching of the insulating film 19 to expose the region A is performed. Herewith, a final pattern forming of the insulating film 19 is finished while avoiding exposing the gate electrode 11. After that, the emitter electrode 20 (refer to FIG. 1B) is formed. At that time, a short failure of the gate electrode 11 and the emitter electrode 20 can be prevented effectively.

According to the processes shown in FIG. 3A to FIG. 3E, the mask 21 to form the trench 22 for the gate electrode 11 are used to form the n-type source layer 13, and therefore, a problem of a positioning accuracy between them does not occur. Besides, it is addressed to a problem of the short failure between the gate electrode 11 and the emitter electrode 20 conceivable when the width of the gate electrode 11 is formed widely (for example, wider than the interval between the trench gate structure portions).

Figure 4:
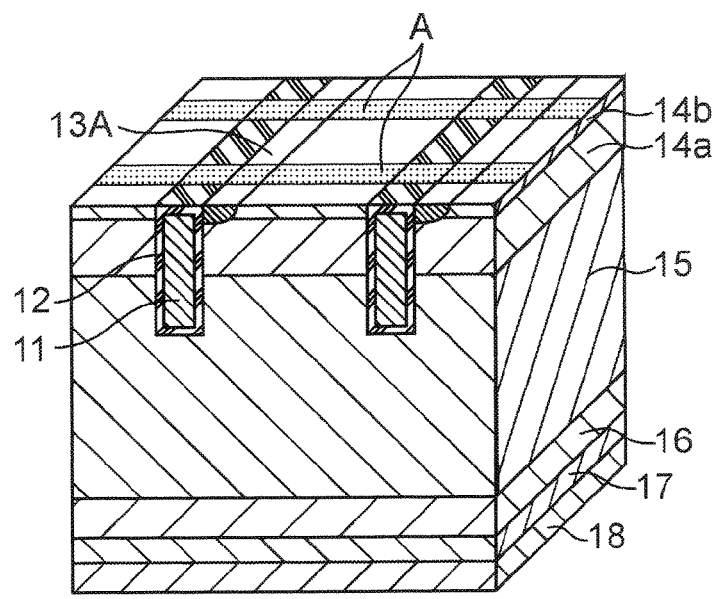
FIG. 4 is a virtually cut perspective view schematically showing a structure of a power semiconductor device (IGBT) according to still another embodiment of the present invention.

Next, still another embodiment of the present invention is described with reference to FIG. 4. FIG. 4 is a virtually cut perspective view schematically showing a structure of a power semiconductor device (IGBT) according to still another embodiment of the present invention. In FIG. 4, the same reference numerals and symbols already described are used to designate the same and corresponding portions, and the description for the portions will not be given. Incidentally, FIG. 4 is a view corresponding to FIG. 1A, and a view corresponding to FIG. 1B is not given because it is obvious.

In this embodiment, n-type source layers 13A are formed only at one side of gate electrodes 11, and therefore one n-type source layer 13A exists per one gate electrode 11. There is a difference in a structure as stated above, but regions in which the emitter electrode 20 (refer to FIG. 1B) is in contact with the n-type source layers 13A and a p-type base layer 14b being semiconductor regions are made to be regions A shown in the drawing, and they are orthogonal to a direction in which intervals of trench gate structure portions are extending, and therefore, a difficulty in positioning does not occur to set contact regions. Besides, because of a contact at the regions A, therefore, the emitter electrode 20 is not in contact with all of upper surfaces of the n-type source layers 13A. Consequently, the portions of the n-type source layers 13A which are not in contact with the emitter electrode 20 become obvious as resistances in case of a load short circuit and so on, and a channel next to the portions disappears. As a result, a channel density decreases to suppress an excessive current, and a breakdown can be prevented In this embodiment, it is possible not to expect a mask alignment accuracy (alignment accuracy with the gate electrodes 11) when the n-type source layers 13A are formed, for example, by an ion implantation while using a mask. This is because a difference of formation widths of the n-type source layers 13A in a right and left direction shown in FIG. 4 does not actually act on a difference of operations. Herewith, acceptable is a alignment of the mask for forming the n-type source layer 13A having an accuracy for an extent that a part of the mask overlaps with a position of the trench in which the gate electrode 11 is formed.

Figure 5:
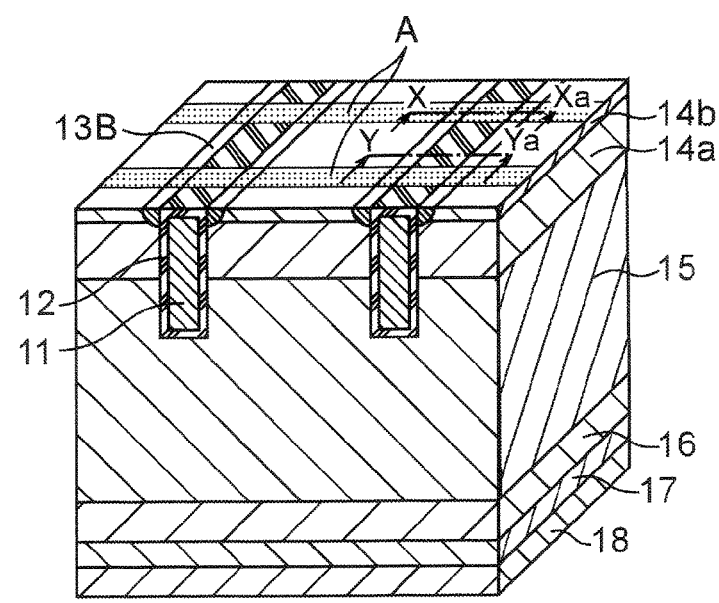
FIG. 5 is a virtually cut perspective view schematically showing a structure of a power semiconductor device (IGBT) according to yet another embodiment of the present invention.
Figure 6A:
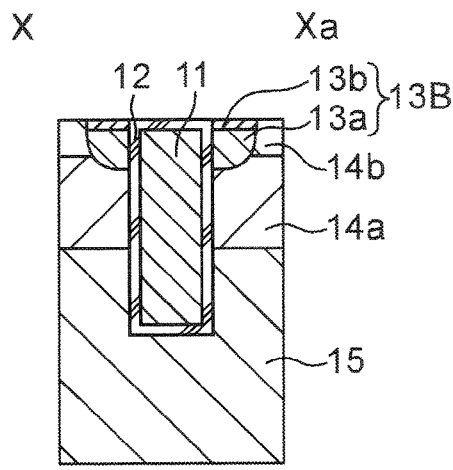
FIG. 6A and FIG. 6B are schematic sectional views respectively taken along a line X-Xa and a line Y-Ya shown in FIG. 5.
Figure 6B:
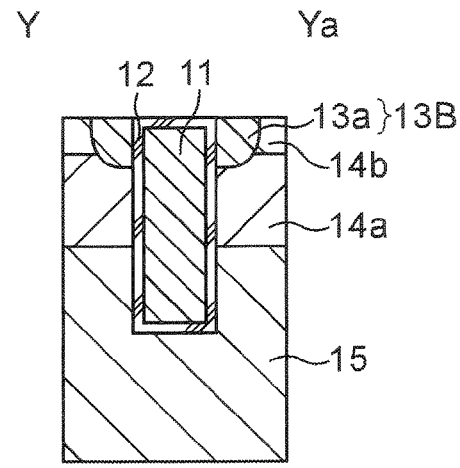

Next, yet another embodiment of the present invention is described with reference to FIG. 5, FIG. 6A, and FIG. 6B. FIG. 5 is a virtually cut perspective view schematically showing a structure of a power semiconductor device (IGBT) according to yet another embodiment of the present invention. FIG. 6A and FIG. 6B are schematic sectional views respectively taken along a line X-Xa and a line Y-Yashown in FIG. 5. In FIG. 5, FIG. 6A, and FIG. 6B, the same reference numerals and symbols already described are used to designate the same and corresponding portions, and the description for the portions will not be given. Incidentally, FIG. 5 is a view corresponding to FIG. 1A, and a view corresponding to FIG. 1B is not given because it is obvious.

In this embodiment, there is a characteristic in a structure of n-type source layers 13B at regions A which are in contact with an emitter electrode. As shown in FIG. 6A, an upper surface which is in contact with the region A is a region of an n-type source layer 13b of which n-type concentration is relatively low, and the other regions are an n-type source layer 13a of which n-type impurity concentration is relatively high, as shown in FIG. 6A and FIG. 6B. To form the n-type source layer 13b, for example, the insulating film 19 (refer to FIG. 1B, FIG. 3E) is formed by an etching, and thereafter, a little p-type impurity (for example, boron) is ion implanted into the regions A.

In the IGBT of the present embodiment, the n-type source layer 13b becomes obvious as a resistance region and an electric potential of the n-type source layer 13a increases when an excessive current is to be flowed caused by, for example, a load short circuit. As a result, a function as a source layer becomes incomplete in the IGBT at this time, and an on-state is not maintained. Namely, a short circuit capacity can further be increased.

Figure 7:
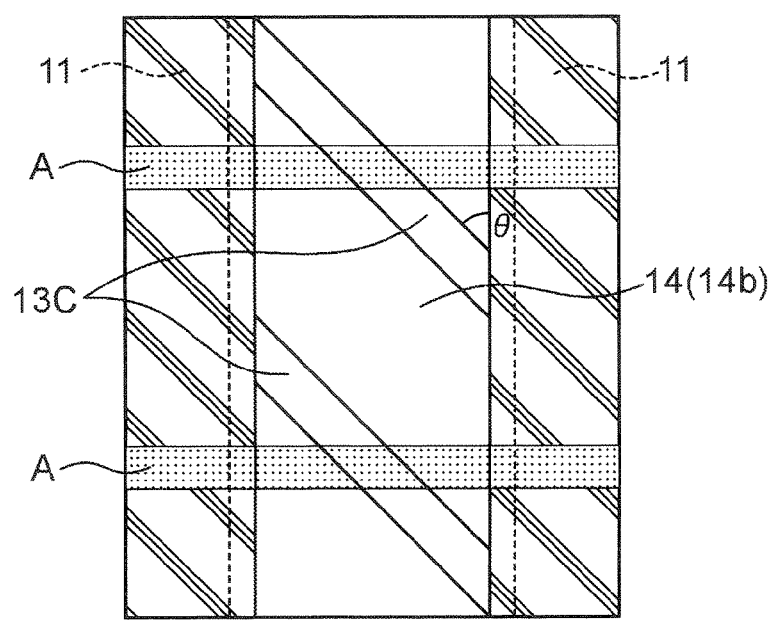
FIG. 7 is an upper surface view of a semiconductor region schematically showing a structure of a power semiconductor device (IGBT) according to yet another embodiment of the present invention.

Next, yet another embodiment of the present invention is described with reference to FIG. 7. FIG. 7 is an upper surface view of a semiconductor region schematically showing a structure of a power semiconductor device (IGBT) according to yet another embodiment of the present invention. In FIG. 7, the same reference numerals and symbols already described are used to designate the same and corresponding portions, and the description for the portions will not be given. FIG. 7 is a view corresponding to the upper surface in FIG. 1A.

In this embodiment, n-type source layers 13C are formed with an angle of θ relative to a direction in which gate electrodes 11 are extending. A positioning of the n-type source layers 13C relative to the positions of the gate electrodes 11 becomes unnecessary by forming the n-type source layers 13C with such oblique angle. Besides, a forming direction of regions A with which the emitter electrode 20 (refer to FIG. 1B) is in contact is orthogonal to a direction in which the gate electrodes 11 are extending as same as the above-stated respective embodiments, and therefore, a positioning accuracy of the regions A and the gate electrodes 11 is also unnecessary.

Some consideration is required for a positioning of the regions A and the n-type source layers 13C, but, for example, if the angle θ is set to be 45 degrees or less, it is preferable because a set allowance of the regions A in a longitudinal direction in the drawing becomes large. The angle θ may be set to be significantly smaller than 45 degrees so that plural regions A can be provided per one n-type source layer 13C sandwiched between the gate electrodes 11.

An improvement in a short circuit capacity is realized also in the IGBT according to this embodiment. It is because of a structure in which the n-type source layer 13C with a certain degree of length is interposing from a region in which the region A and the n-type source layer 13C are overlapped, to a channel formed at a p-type base layer 14 facing the gate electrode 11. Besides, it is also possible to increase a channel density by reducing intervals between the n-type source layers 13C to form a number of n-type source layers 13C, and it is also possible to realize an elimination of on-state voltage.

In the above, embodiments of the present invention have been described. In case of MOSFETs, embodiments thereof can be easily obtained similarly to above-mentioned embodiments of IGBTs. Namely, the structure upper than and including the n-type base layer 15 is the same as that of IGBTs, and the p-type emitter layer 17 is omitted. In case of MOSFETs, the upper electrode in respective FIGS. is a source electrode, and the lower electrode is a drain electrode. Besides, it is also possible to obtain a semiconductor device having an opposite conductivity type by making the respective semiconductor layers having the n-type conductivity or the p-type conductivity be given an opposite conductivity.

The present invention is not limited to the illustrated respective embodiments, but to be understood that all the changes and modifications without departing from the range of the following claims are to be included therein.

What is claimed is:

1. A power semiconductor device, comprising:
   a gate electrode having a cross section having a length in a vertical direction, the gate electrode having a shape extending in a direction orthogonal to the cross section;
   a gate insulating film surrounding the gate electrode;
   an n-type source layer positioning to face the gate electrode via a part of the gate insulating film;
   a p-type base layer adjacent to the n-type source layer and positioning to face the gate electrode via another part of the gate insulating film;
   an n-type base layer adjacent to the p-type base layer and positioning to face the gate electrode via still another part of the gate insulating film without being in contact with the n-type source layer; and
   a main electrode being in contact with the n-type source layer with a first lateral plane and in contact with the p-type base layer with a second lateral plane, the first lateral plane and the second lateral plane extending as a single lateral plane in a direction crossing the direction in which the gate electrode is extending.

2. The power semiconductor device according to claim 1, wherein the gate electrode is included in a trench gate structure.

3. The power semiconductor device according to claim 2, wherein the gate electrode included in the trench gate structure is formed plural in parallel with the direction in which the gate electrode is extending, and intervals between portions of the trench gate structures in which the plural gate electrodes are respectively included are 1 µm or less.

4. The power semiconductor device according to claim 3, wherein portions of the trench gate structures in which the plural gate electrodes are respectively included respectively have widths of 0.5 µm to 2 µm.

5. The power semiconductor device according to claim 1, wherein the n-type source layer is extendingly formed in parallel with the direction in which the gate electrode is extending.

6. The power semiconductor device according to claim 1, wherein the p-type base layer is composed of a region whose p-type concentration is relatively low and a region whose p-type concentration is relatively high, the region whose p-type concentration is relatively high is in contact with the main electrode, the region whose p-type concentration is relatively low is not in contact with the main electrode.

7. The power semiconductor device according to claim 1, wherein the n-type source layer exists two per one of the gate electrode.

8. The power semiconductor device according to claim 1, wherein the n-type source layer exists one per one of the gate electrode.

9. The power semiconductor device according to claim 1, wherein the n-type source layer is composed of a region whose n-type concentration is relatively low and a region whose n-type concentration is relatively high, the region whose n-type concentration is relatively low is in contact with the main electrode, the region whose n-type concentration is relatively high is not in contact with the main electrode.

10. The power semiconductor device according to claim 1, wherein the n-type source layer is extendingly formed with an angle of 45 degrees or less relative to the direction in which the gate electrode is extending.

11. The power semiconductor device according to claim 1, wherein the first lateral plane and the second lateral plane extend as the single lateral plane in a direction orthogonal to the direction in which the gate electrode is extending.

12. The power semiconductor device according to claim 1, wherein the single lateral plane having the first lateral plane and the second lateral plane is disposed repeatedly with intervals of from 1 µm to 10 µm.

13. The power semiconductor device according to claim 1, wherein the p-type base layer has boron.

14. The power semiconductor device according to claim 1, wherein the n-type base layer has phosphor.

15. The power semiconductor device according to claim 1, further comprising a insulating film being in contact with the n-type source layer and the p-type base layer complimentarily with the main electrode.

16. A power semiconductor device, comprising:
   a control electrode having a cross section having a length in a vertical direction, the control electrode having a shape extending in a direction orthogonal to the cross section;
   an insulating film surrounding the control electrode;
   a first semiconductor layer having a first conductivity type, positioning to face the control electrode via a part of the insulating film;
   a second semiconductor layer having a second conductivity type, adjacent to the first semiconductor layer and positioning to face the control electrode via another part of the insulating film;
   a third semiconductor layer having the first conductivity type, adjacent to the second semiconductor layer and positioning to face the control electrode via still another part of the insulating film without being in contact with the first semiconductor layer;
   a first main electrode being in contact with the first semiconductor layer with a first lateral plane and in contact with the second semiconductor layer with a second lateral plane, the first lateral plane and the second lateral plane extending as a single lateral plane in a direction crossing the direction in which the control electrode is extending; and
   a second main electrode provided in a side opposite to the first main electrode through the third semiconductor layer.

17. The power semiconductor device according to claim 16, wherein the control electrode is included in a trench structure.

18. The power semiconductor device according to claim 16, wherein the first semiconductor layer is extendingly formed in parallel with the direction in which the control electrode is extending.

19. The power semiconductor device according to claim 16, wherein the first semiconductor layer is composed of a region whose impurity concentration is relatively low and a region whose impurity concentration is relatively high, the region whose impurity concentration is relatively low is in contact with the first main electrode, the region whose impurity concentration is relatively high is not in contact with the first main electrode.

20. The power semiconductor device according to claim 16, wherein the first semiconductor layer is extendingly formed with an angle of 45 degrees or less relative to the direction in which the control electrode is extending.

* * * * *